United States Patent
Koike (10) Patent No.: US 7,224,187 B2
(45) Date of Patent: May 29, 2007

(54) CMOS BUFFER CIRCUITS AND INTEGRATED CIRCUITS USING THE SAME

(75) Inventor: Hideharu Koike, Yokohama (JP)

(73) Assignee: Winbond Electronics Corp., Hsinchu (TW)

( * ) Notice: Subject to any disclaimer, the term of this patent is extended or adjusted under 35 U.S.C. 154(b) by 76 days.

(21) Appl. No.: 11/217,344

(22) Filed: Sep. 2, 2005

(65) Prior Publication Data

US 2007/0052447 A1    Mar. 8, 2007

(51) Int. Cl.
*H03K 19/094* (2006.01)

(52) U.S. Cl. .......................................... 326/83; 326/86

(58) Field of Classification Search ............ 326/82–83, 326/86, 27; 327/108, 109
See application file for complete search history.

(56) References Cited

U.S. PATENT DOCUMENTS 5,317,206 A * 5/1994 Hanibuchi et al. ............ 326/21
5,623,216 A * 4/1997 Penza et al. ................... 326/27
6,686,773 B1 * 2/2004 Dash et al. ..................... 326/83

* cited by examiner

*Primary Examiner*—James H. Cho
(74) *Attorney, Agent, or Firm*—Birch, Stewart, Kolasch & Birch, LLP (57) ABSTRACT

CMOS buffer circuits with reduced short circuit current. In the CMOS buffer circuit, an output stage drives an output terminal and comprises a first output transistor of a first conductive type and a second output transistor of a second conductive type. An output driving unit produces a first signal to turn off the first output transistor according to a delay signal. A bidirectional delay unit is controlled by the input signal to turn on the second output transistor after the first output transistor be turned off. In the bidirectional delay unit, a bidirectional logic unit generates two logic signals according to an inversion signal of the input signal, first and second bidirectional buffers are coupled to the output driving unit, generating a second signal to turn on the second output transistor according to the input signal and the two logic signals.

13 Claims, 11 Drawing Sheets

CMOS BUFFER CIRCUITS AND INTEGRATED CIRCUITS USING THE SAME

BACKGROUND

The invention relates to buffer circuits, and more particularly, to buffer circuits with a reduced short circuit current and integrated circuits and ring oscillation circuits using the same.

CMOS buffer circuits are widely applied to drive devices connected to an output stage thereof. Generally, the power consumption of CMOS circuit is dynamic power consumption or short circuit power consumption. Dynamic power consumption is inevitable due to electric characteristics of CMOS buffer circuits, but short circuit power consumption results in wasted power. With advance of process technology, the smaller gate length of MOS transistors reduces the threshold voltage of the MOS transistors, such that short circuit current often occurs. To reduce short circuit power consumption, it is reasonable to focus to reduce short circuit current of buffers with high switching rate, such as clock buffers. The short circuit current of CMOS buffers also causes electronmagnetic interference (EMI). Thus, it is very important to reduce short circuit current for CMOS buffer circuits.

Figure 1:
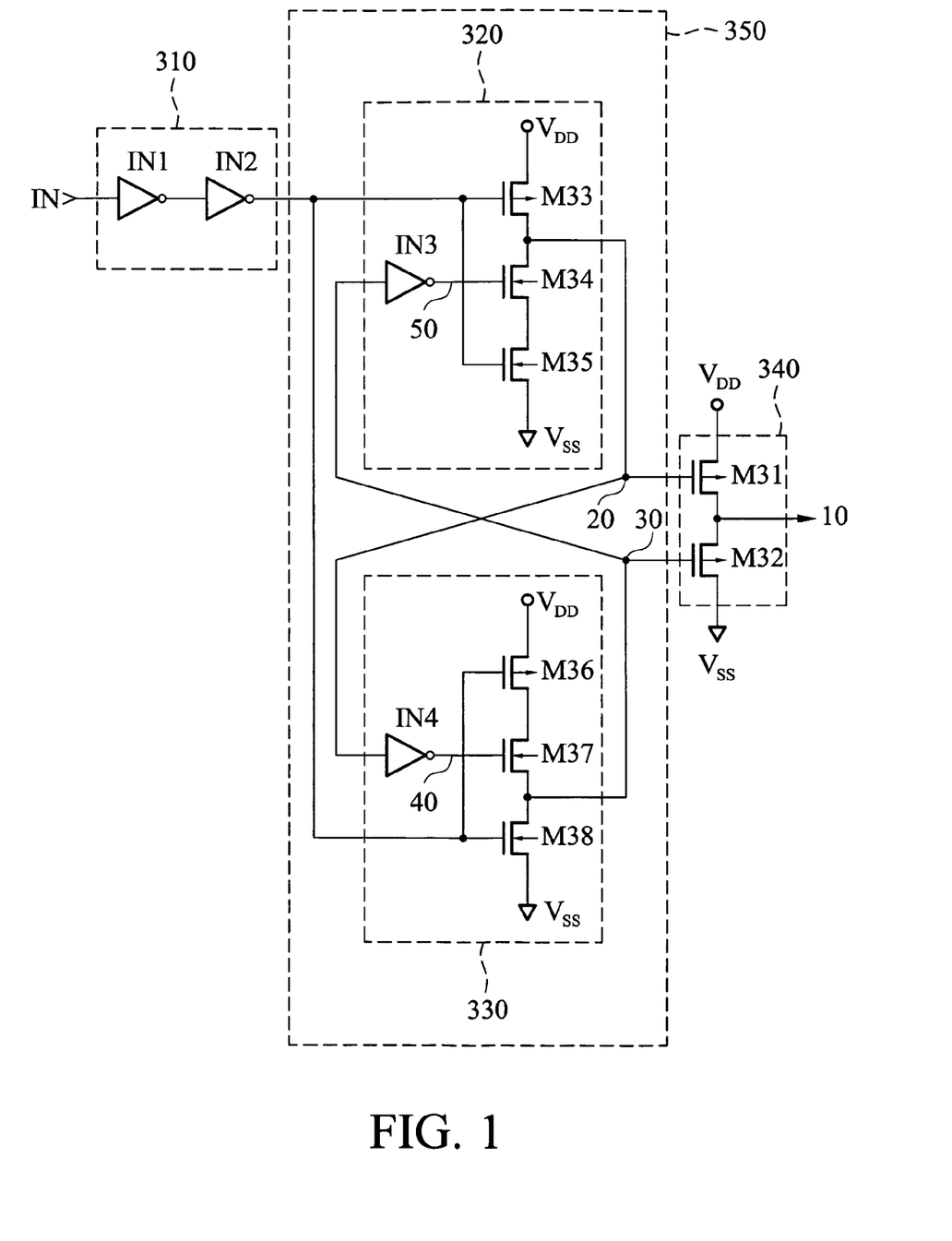
FIG. 1 shows a conventional CMOS buffer circuit.

Many conventional methods have been disclosed to reduce short circuit current for buffer circuits. FIG. 1 shows a conventional CMOS buffer circuit 200 with reduced short circuit current. However, a short circuit current occurs not only in pre-driving stage 310 but also the output buffer driving stage 350. For example, when input (IN) is low in the beginning, the nodes 20 and 30 are at high, such that the transistors M36–M37 are turned on and transistor M38 is turned off. When the input (IN) goes high from low, the transistor M38 is turned on, the transistor M36 is turned off and the transistor M37 stays on until the voltage level at the node 20 goes low. Because gate terminals of the transistors M36 and M38 are connected, the transistors M36 and M38 are both turned on when the gate voltage crosses the middle range between the power voltage and the ground voltage, generating a short current through the transistors M36–M38. Further, as voltage levels at the nodes 20 and 30 go low from high, the PMOS transistors and NMOS transistors of inverters IN3 and IN4 are both turned on when the input terminals of cross the middle range between the power voltage and the ground voltage. Thus, there is a short circuit through the inverters IN3 and IN4. Similarly, when the input (IN) goes low from high, there is a short circuit current through the transistor M33–M35 and through the inverters IN3 and IN4.

Figure 2:
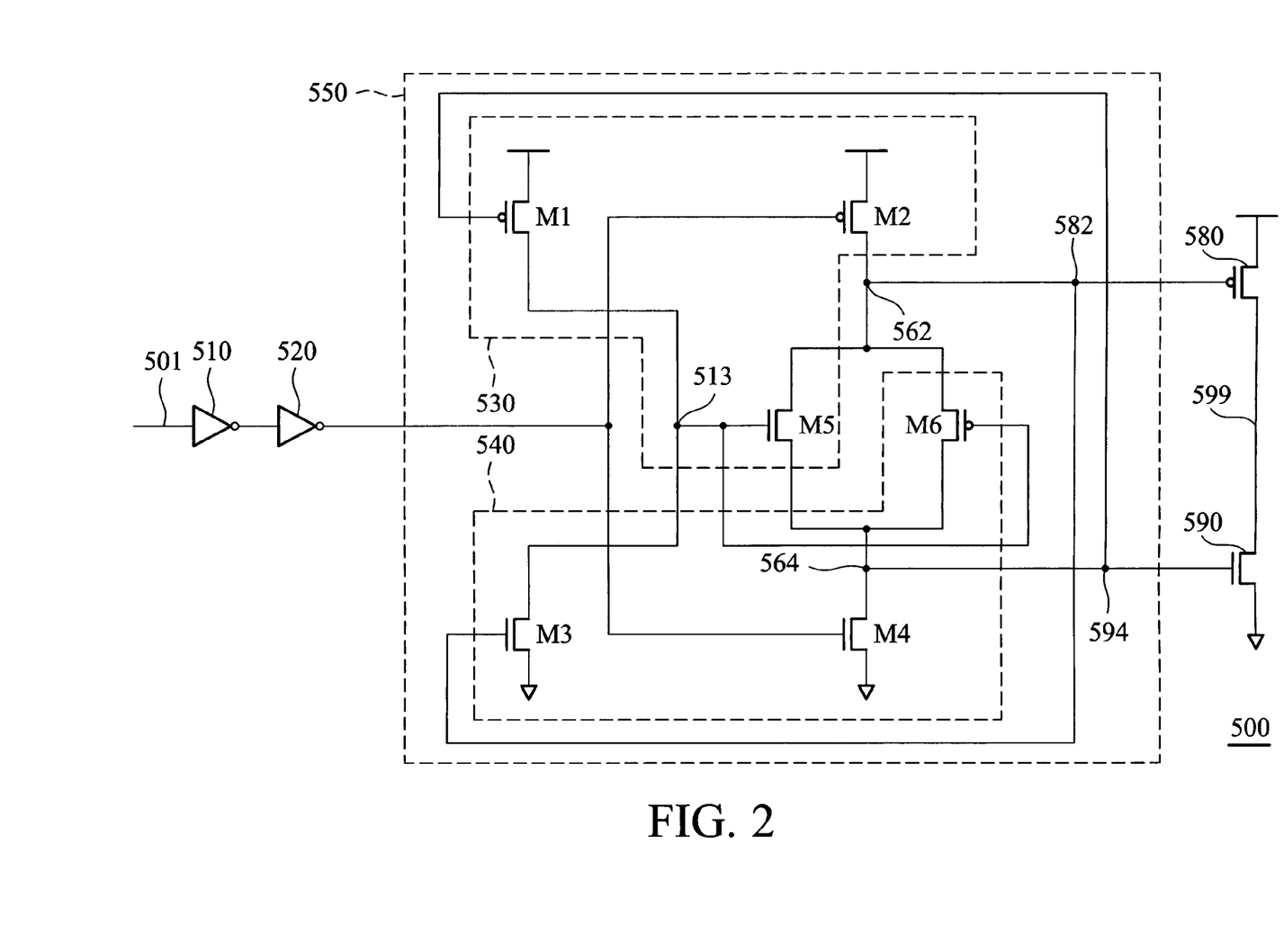
FIG. 2 shows another conventional CMOS buffer circuit.

FIG. 2 shows another conventional CMOS buffer circuit 500 with reduced short circuit current. When the input terminal 501 goes high from low, the voltage level at node 582 stays high but the voltage level at node 594 goes low from high, such that transistors M1 and M3 are turned on at the same time until the voltage level of node 582 is discharged to low, generating a short circuit through the transistors M1 and M3. Further, because the gate terminals of the transistors M5 and M6 are connected, one of the transistors M5 and M6 is always turned on, allowing a short circuit current through the transistors M5 and M6 when the input terminal 501 changes.

Namely, there is still a short circuit current through the output buffer driving stage 350 shown in FIG. 1 and the output buffer driving stage 550 shown in FIG. 2.

SUMMARY

The invention provides a CMOS buffer circuit with reduced short circuit current.

The invention discloses embodiments of a CMOS buffer circuit, in which an output stage drives an output terminal and comprises a first output transistor of a first conductive type and a second output transistor of a second conductive type. An output driving unit produces a first signal to turn off the first output transistor according to a delay signal. A bidirectional delay unit is controlled by the input signal to turn on the second output transistor after the first output transistor is turned off. In the bidirectional delay unit, a bidirectional logic unit generates two logic signals according to an inversion signal of the input signal, the first and second bidirectional buffers are coupled to the output driving stage, generating a second signal to turn on the second output transistor according to the input signal and the two logic signals.

The invention also discloses embodiments of an integrated circuit, in which at least two stages of the disclosed CMOS buffer circuit are connected in series, and the output terminal of each stage is coupled to the output driving unit of the next stage.

The invention also discloses embodiments of a ring oscillation circuit, in which first and second CMOS buffer circuits as disclosed are connected in series, and the output terminal of first CMOS buffer circuit is coupled to the output driving unit of the second CMOS buffer circuit. An inverter comprises an input terminal coupled to the output terminal of the second CMOS buffer circuit and an output terminal coupled to the input terminal of the first CMOS buffer circuit.

DESCRIPTION OF THE DRAWINGS

The invention can be more fully understood by the subsequent detailed description and examples with reference made to the accompanying drawings, wherein.

DETAILED DESCRIPTION

Figure 3:
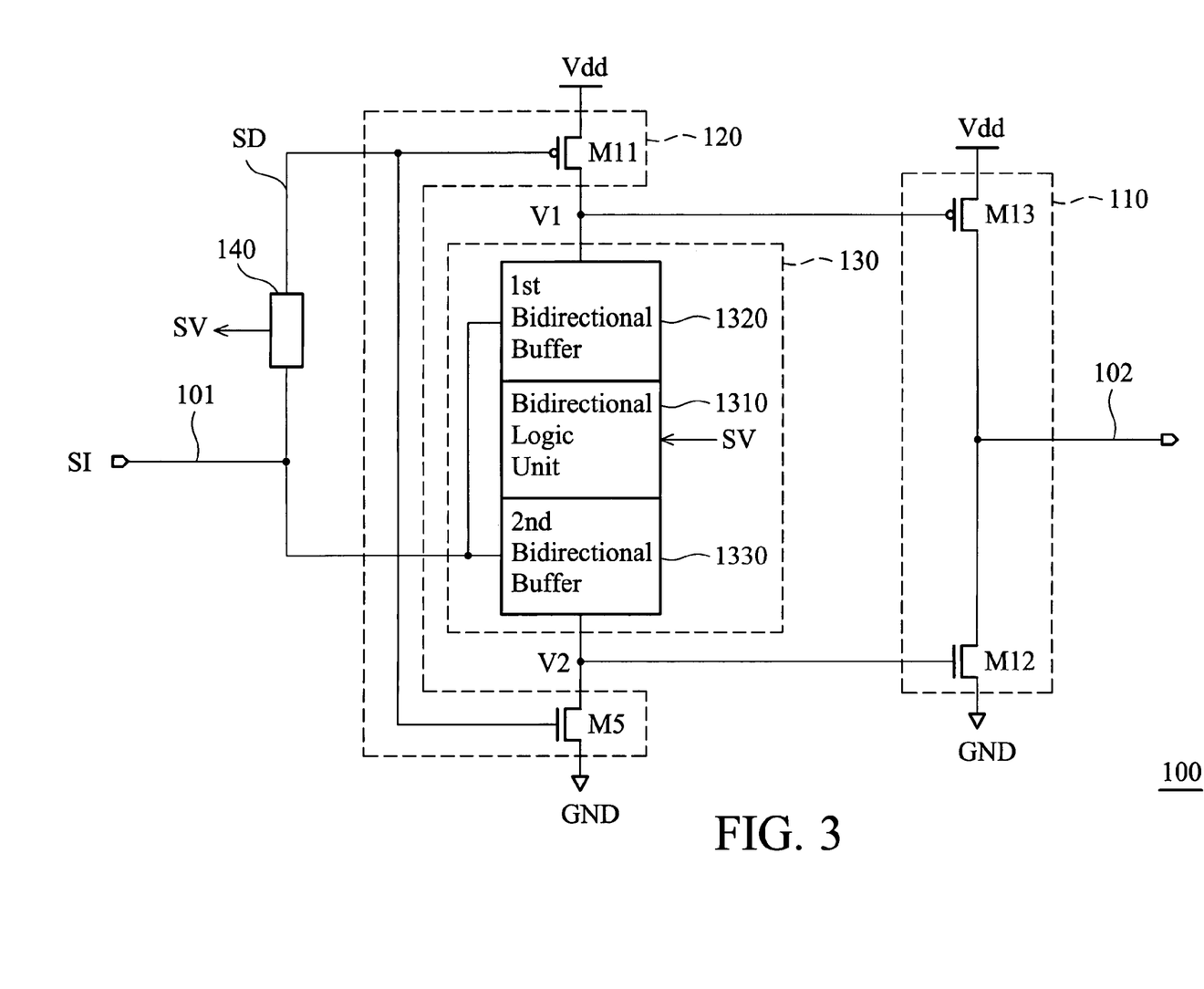
FIG. 3 shows a CMOS buffer circuit according to the invention.

FIG. 3 is a diagram of a CMOS buffer circuit. As shown, the CMOS buffer circuit 100 comprises an input terminal 101, an output stage 110, an output driving unit 120, a bidirectional delay unit 130 and a delay circuit 140.

The input terminal 101 receives an input signal SI, and the output stage 110 comprises a PMOS transistor M13 and an NMOS transistor M12, driving an output terminal 102. The PMOS transistor M13 comprises a first terminal coupled to the first power source Vdd, a second terminal coupled to the output terminal 102, and a control terminal coupled to the output driving unit 120. The NMOS transistor M12 comprises a first terminal coupled to the output terminal 102, a second terminal coupled to the second power source GND, and a control terminal coupled to the output driving unit 120.

The output driving unit 120 produces a first signal V1/V2 to turn off the MOS transistor M13/M12 according to a delay signal SD. The output driving unit 120 comprises a PMOS transistor M11 and a NMOS transistor M5, the PMOS transistor M11 comprising a first terminal coupled to the first power source Vdd, a second terminal coupled to the control terminal of the PMOS transistor M13, and a control terminal coupled to the delay signal SD. The NMOS transistor M5 comprises a first terminal coupled to the control-terminal of the PMOS transistor M12, a second terminal coupled to the second power source GND, and a control terminal coupled to the delay signal SD.

The bidirectional delay unit 130 is controlled by the input signal SI to turn on the MOS transistor M12/M13 after the MOS transistor M13/M12 is turned off. The bidirectional delay unit 130 comprises a bidirectional logic unit 1310, and first and second bidirectional buffers 1320 and 1330. The bidirectional logic unit 1310 generates two logic signals (not shown) according to an inversion signal SV of the input signal SI. The bidirectional logic unit 1310 can be a bidirectional logic gate or a bidirectional logic chain comprising a plurality of bidirectional logic gates connected in series. The first and second bidirectional buffers 1320 and 1330 are coupled to the output driving unit 120, generating a second signal V2/V1 to turn on the MOS transistor M12/M13 according to the input signal SI and the two logic signals.

For example, when the input signal SI goes low from high, the output driving unit 120 produces the first signal V1 to turn off the MOS transistor M13 according to the delay signal SD. The bidirectional delay unit 130 turns on the MOS transistor M12 after the MOS transistor M13 is turned off, according to the input signal SI. Alternately, when the input signal SD goes high from low, the output driving unit 120 produces the first signal V2 to turn off the MOS transistor M12 according to the delay signal SD. The bidirectional delay unit 130 turns on the MOS transistor M13 after the MOS transistor M12 is turned off, according to the input signal SI. Thus, the PMOS transistor M13 and the NMOS transistor M12 are not turned on simultaneously when the input signal SD goes low from high or goes high from low, thereby preventing short circuit current.

Figure 4A:
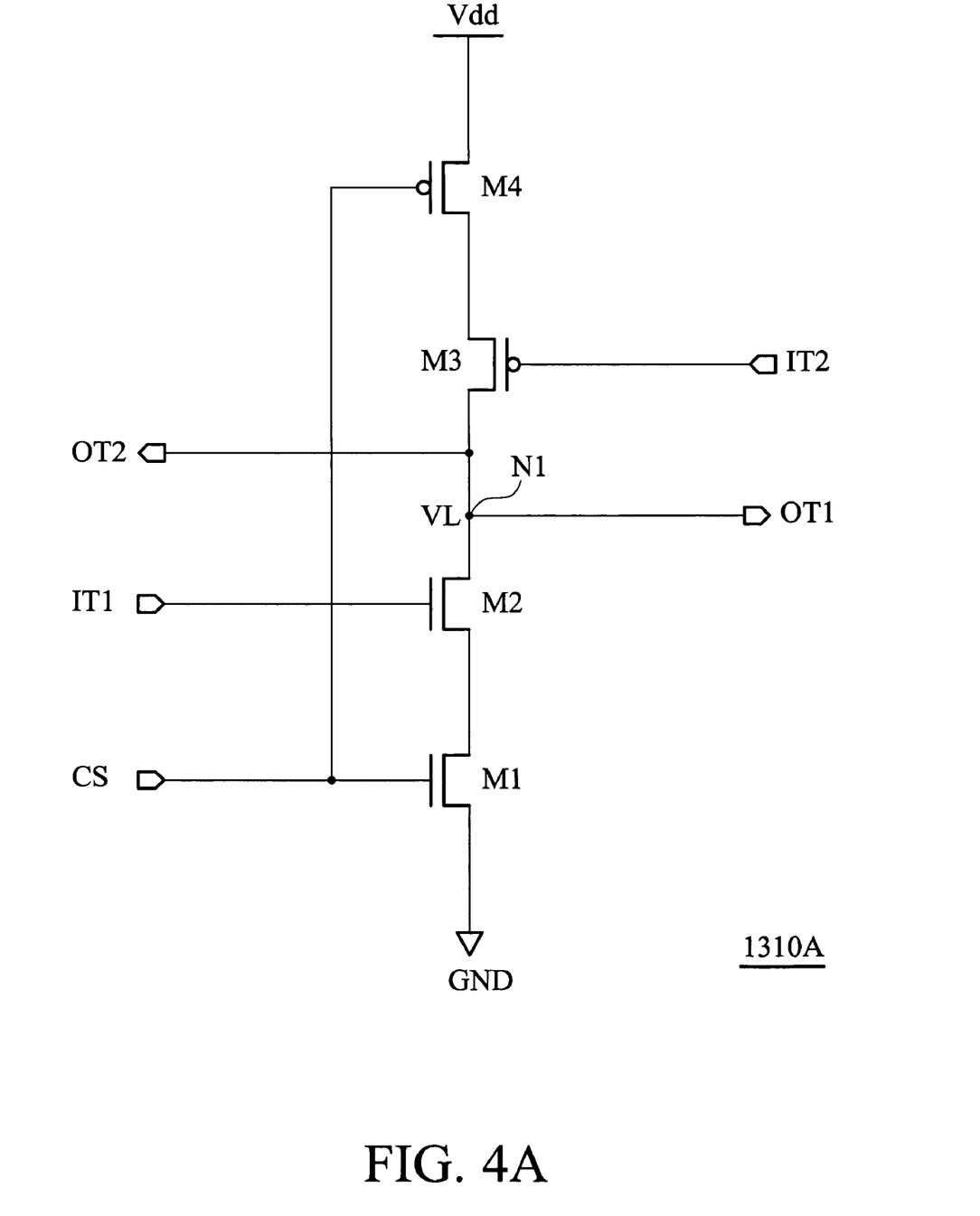
FIG. 4A shows an embodiment of a bidirectional logic gate.

FIG. 4A shows an embodiment of a bidirectional logic gate. As shown, the bidirectional logic gate 1310A generates two logic signals OT1 and OUT2 according to a control signal CS and two input signals IT1 and IT2, and comprises two NMOS transistors M1 and M2 and two PMOS transistor M3 and M4. The NMOS transistor M1 comprises a first terminal coupled to the second power source GND, a control terminal coupled to a control signal CS, and a second terminal. The NMOS transistor M2 comprises a first terminal coupled to the second terminal of the NMOS transistor M1, a control terminal coupled to the input signal IT1, and a second terminal coupled to the node N1. The PMOS transistor M3 comprises a first terminal coupled to the node N1, a control terminal coupled to the input signal IT2, and a second terminal. The PMOS transistor M4 comprises a first terminal coupled to the second terminal of the PMOS transistor M3, a control terminal coupled to the control signal CS, and a second terminal coupled to the first power source Vdd.

When control signal CS is high, the transistors M1 and M4 are turned on and off respectively, and the voltage VL at the node N1 goes low if the input signal IT1 is high, otherwise the voltage VL stays high-impedance (Hiz). Thus, the bidirectional logic gate 1310A generates the voltage VL with a low voltage level, serving as the two logic signals OT1 and OT2, for output to the first and second bidirectional buffers 1320 and 1330. Alternately, when control signal CS is low, the transistors M1 and M4 are turned off and on respectively, and the voltage VL at the node N1 goes high if the input signal IT2 is low, otherwise the voltage VL stays high-impedance (Hiz). Thus, the bidirectional logic gate 1310A generates the voltage VL with a high voltage level, serving as the two logic signals OT1 and OT2, for output to the first and second bidirectional buffers 1320 and 1330.

Figure 4B:
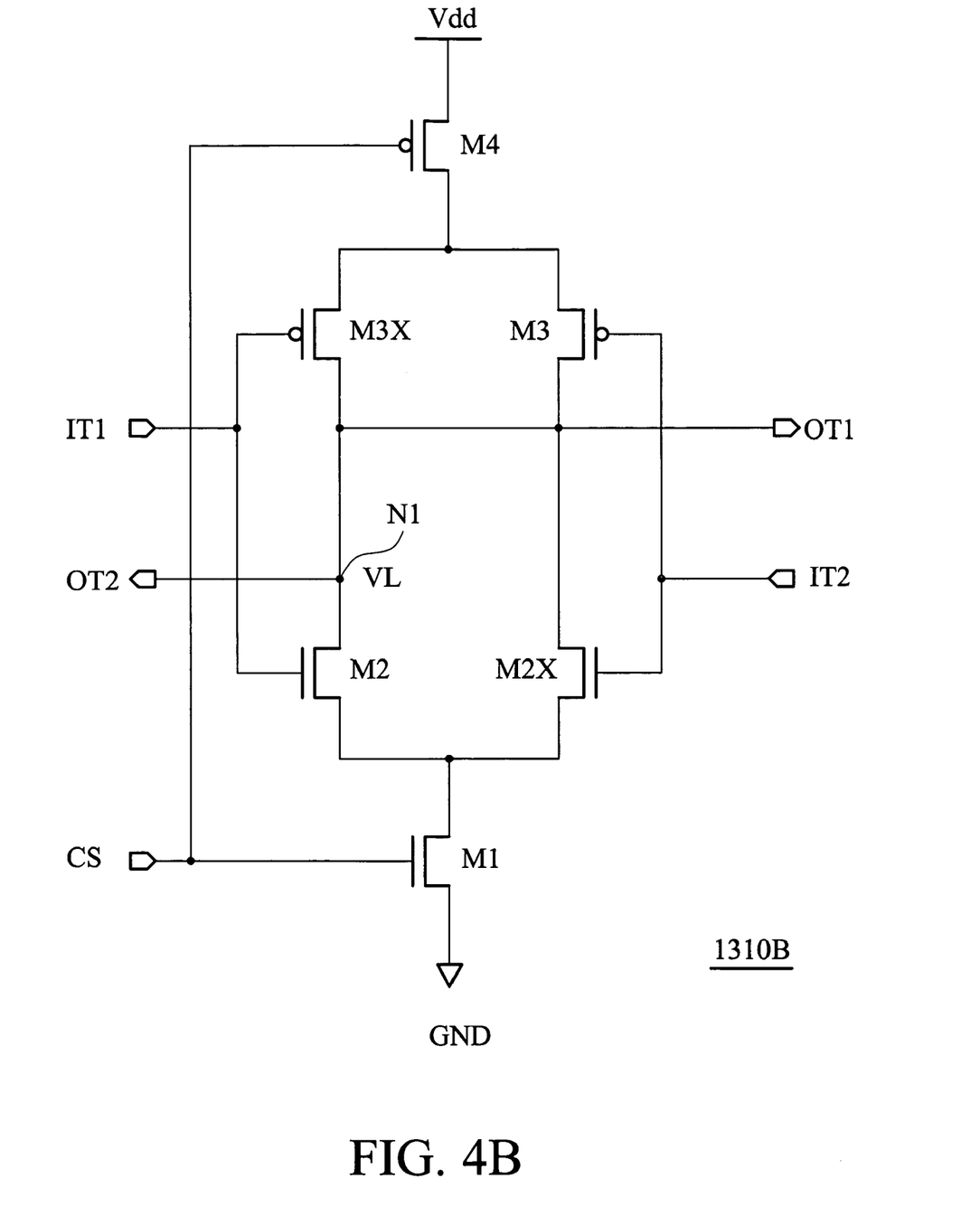
FIG. 4B shows another embodiment of a bidirectional logic gate.

FIG. 4B shows another embodiment of a bidirectional logic gate. As shown, the bidirectional logic gate 1310B is similar to the logic gate 1310A shown in FIG. 4A with the exception of the NMOS transistors M3X and the PMOS transistor M2X. The NMOS transistor M2X is coupled between the node N1 and the second terminal of the NMOS transistor M1 and comprises a control terminal coupled to the input signal IT1. The PMOS transistor M3X is coupled between the node N1 and the second terminal of the PMOS transistor M4 and comprises a control terminal coupled to the input signal IT2.

When control signal CS is high, the transistors M1 and M4 are turned on and off respectively, and the voltage VL at the node N1 goes low if the input signal IT1 or the input signal IT2 is high, otherwise the voltage VL stays high-impedance (Hiz). Thus, the bidirectional logic gate 1310B generates the voltage VL with a low voltage level, serving as the two logic signals OT1 and OT2, for output to the first and second bidirectional buffers 1320 and 1330. Alternately, when control signal CS is low, the transistors M1 and M4 are turned off and on respectively, and the voltage VL at the node N1 goes high if the input signal IT1 or the input signal IT2 is high, otherwise the voltage VL stays high-impedance (Hiz). Thus, the bidirectional logic gate 1310A generates the voltage VL with low voltage level, serving as the two logic signals OT1 and OT2, for output to the first and second bidirectional buffers 1320 and 1330.

First Embodiment

Figure 5A:
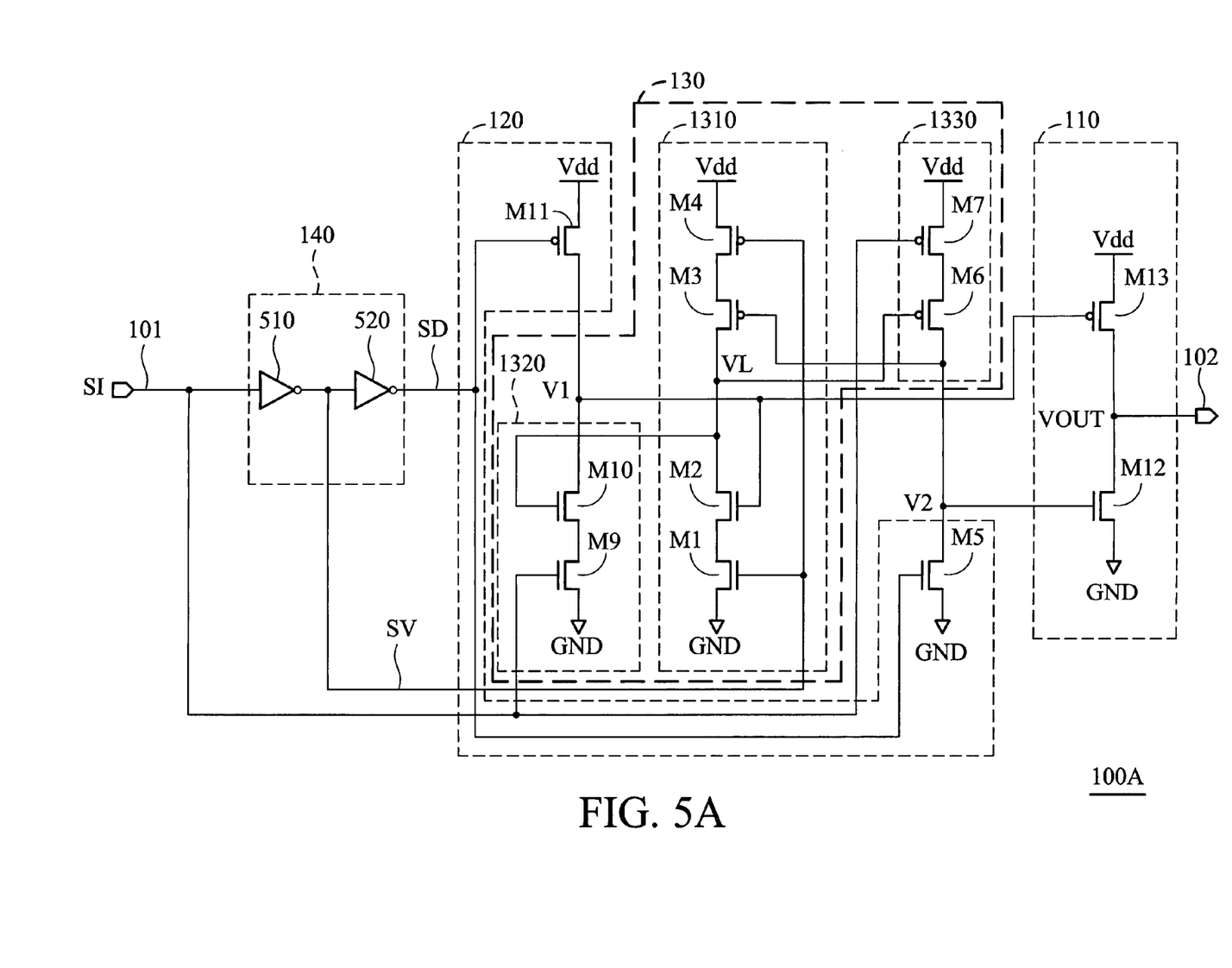
FIG. 5A shows a first embodiment of a bidirectional buffer circuit.

FIG. 5A shows a first embodiment of a buffer circuit. As shown, the buffer circuit 100A comprises an input terminal 101, an output stage 110, an output driving unit 120, a bidirectional delay unit 130 and a delay circuit 140. The output stage 110 and output driving unit 120 are similar to those in the buffer circuit 100 shown in FIG. 3, and the bidirectional logic unit 1310 is similar to the bidirectional logic gate 1310A shown in FIG. 4A.

In the bidirectional logic unit 1310, the control terminal of the PMOS transistor M3 is coupled to the voltage V2, and the control terminal of the NMOS transistor M2 is coupled to the voltage V1. The control terminals of the transistors M1 and M4 are coupled to the inversion signal SV from the delay circuit 140. The voltage VL serves as the first and second logic signals and is coupled to the bidirectional buffers 1320 and 1330.

The bidirectional buffer 1330 comprises two PMOS transistors M6 and M7 connected between the first power source Vdd and the voltage V2. The bidirectional buffer 1320 comprises two NMOS transistors M9 and M10 connected between the voltage V1 and the second power source GND. Control terminals of the transistors M7 and M9 are coupled to the input signal SI, and control terminals of the transistors M6 and M10 are coupled to the voltage V1.

The delay circuit 140 comprises two inverters 510 and 520 connected in series, in which the inverter 510 generates an inversion signal SV of the input signal SI, and the inverter 520 generates the delay signal SD.

Figure 6:
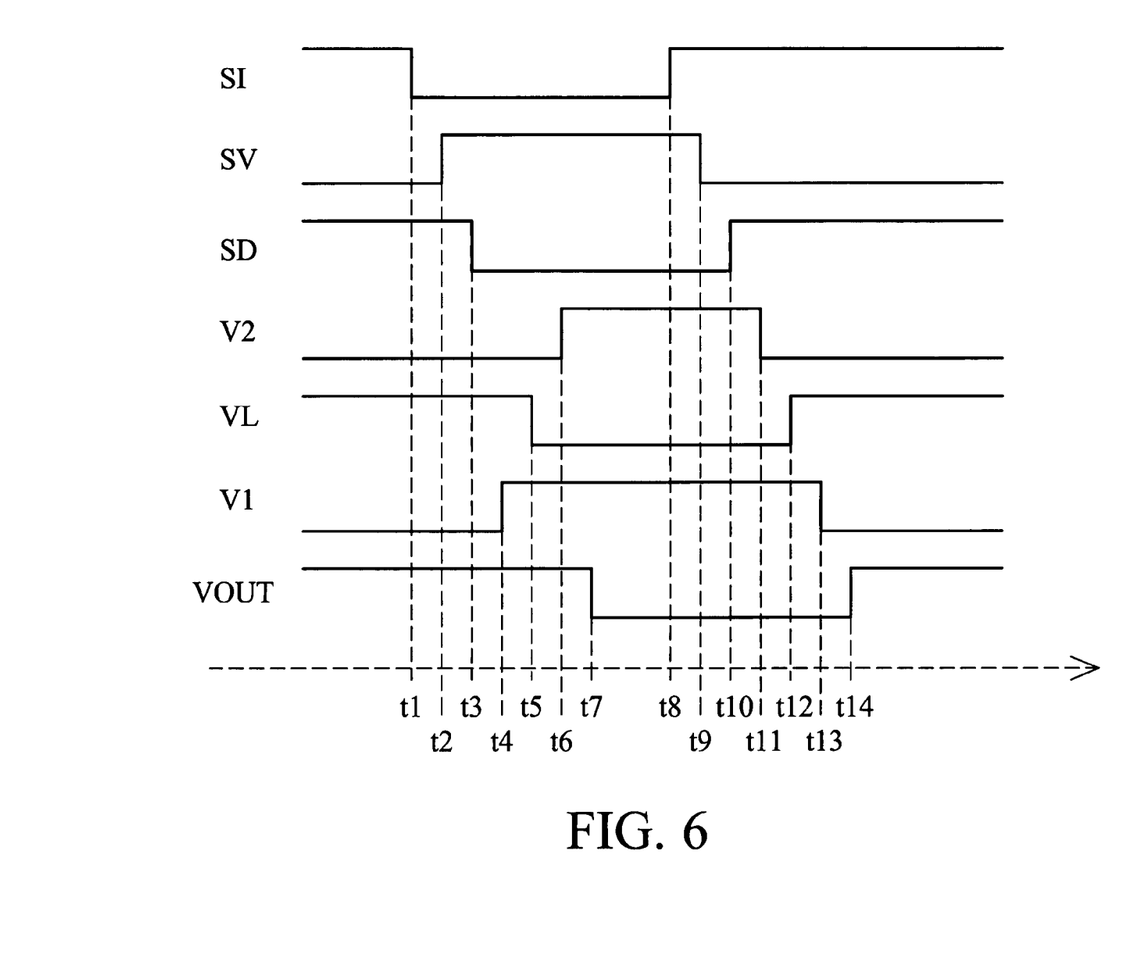
FIG. 6 is a timing chart of the buffer circuit as shown in FIG. 5A.

The operation of the buffer circuit 100A is discussed with reference to the FIGS. 5A and 6. As shown in FIG. 6, the input signal SI stays high, the inversion signal SV stays low and the delay signal SD stays high in the beginning. Accordingly, the voltages V1 and V2 both stay low and the voltage VL stays high, and thus, the voltage VOUT at the output terminal 102 stays high.

At time t1, the input signal SI goes low, the transistors M7 and M9 are turned on and off respectively. Because the voltage VL still stays high, the transistor M6 is maintained off and thus, there is no short circuit current through the transistors M5–M7 in this transition.

At time t2, the inversion signal SV goes high, the transistors M1 and M4 are turned on and off respectively. Because the voltage V1 still stays low, the transistor M2 is maintained off, and thus, there is no short circuit current through the transistors M1–M4 in this transition. At time t3, the delay signal SD goes low, the transistors M5 and M11 are turned off and on respectively. Because the transistor M9 is turned off by the input signal SI, there is no short circuit current through the transistors M9–M11 in this transition.

At time t4, the voltage V1 goes high because the transistor M11 is turned on at time t3. Due to V1 high level, the transistor M13 is turned off. Namely, the output driving unit 120 produces the voltage V1 to turn off the transistor M13 according to a delay signal SD.

At time t5, due to the V1 high level, the transistor M2 is turned on. The voltage VL goes low, because the transistors M1 and M2 are both turned on. Namely, the bidirectional logic unit 1310 generates the voltage VL (logic signals) according to the inversion signal SV of the input signal SI. Because the transistor M4 is turned off, there is no short circuit current through the transistors M1–M4 in this transition.

At time t6, due to the VL low level, the transistors M6 and M10 are turned on and off. The voltage V2 goes high, because the transistors M6–M7 are both turned on. Because the transistor M5 is turned off, there is no short circuit current through the transistors M5–M7 in this transition.

At time t7, due to the V2 high level, the transistors M12 is turned on to drive the output terminal 102, and thus, the voltage VOUT at the output terminal 102 goes low. Namely, the first and second bidirectional buffers 1320 and 1330 generate the voltage V2 to turn on the transistor M12 according to the input signal SI and the voltage VL (the first logic signal and the second logic signal). Thus, transistor M12 is turned on after the transistor M13 is turned off. Namely, the transistors M12 and M13 are not turned on simultaneously, such that there is no short circuit current through transistors M12 and M13. In view of this, there is no short circuit current in the output stage 110, the output driving unit 120 and the bidirectional delay unit 130 when the input signal SI goes high from low.

Alternately, the input signal SI goes high at time t8, and the transistors M7 and M9 are turned off and on respectively. Because the voltage VL still stays low, the transistor M10 is maintained off, and there is no short circuit current through the transistors M9–M11 in this transition.

At time t9, the inversion signal SV goes low, the transistors M1 and M4 are turned off and on respectively. Because the voltage V2 still stays high, the transistor M3 is maintained off, and there is no short circuit current through the transistors M1–M4 in this transition.

At time t10, the delay signal SD goes high, and the transistors M5 and M11 are turned on and off respectively. Because the transistor M7 is turned off by the input signal SI, and there is no short circuit current through the transistors M5–M7 in this transition.

At time t11, the voltage V2 goes low because the transistor M5 is turned on at time t10. Due to the V2 low level, the transistor M12 is turned off. Namely, the output driving unit 120 produces the voltage V2 to turn off the transistor M12 according to a delay signal SD.

At time t12, due to the V2 low level, the transistor M3 is turned on. The voltage VL goes high, because the transistors M3 and M4 are both turned on. Namely, the bidirectional logic unit 1310 generates the VL (logic signals) high level according to the inversion signal SV of the input signal SI. Because the transistor M1 is turned off, there is no short circuit current through the transistors M1–M4 in this transition.

At time t13, due to the VL high level, the transistors M6 and M10 are turned off and on. The voltage V1 goes low, because the transistors M9–M10 are both turned on. Because the transistor M11 stays off, there is no short circuit current through the transistors M9–M11 in this transition.

At time t14, due to the voltage V1 of low level, the transistor M13 is turned on to drive the output terminal 102, and the voltage VOUT at the output terminal 102 goes high. Namely, the first and second bidirectional buffers 1320 and 1330 generate the voltage V1 to turn on the transistor M13 according to the input signal SI and the voltage VL (the first logic signal and the second logic signal). Thus, transistor M13 is turned on after the transistor M12 is turned off. Namely, the transistors M12 and M13 are not turned on simultaneously, such that there is no short circuit current through transistors M12 and M13. In view of this, there is no short circuit current in the output stage 110, the output driving unit 120 and the bidirectional delay unit 130 when the input signal SI goes low from high.

Because there is no short circuit current in the output stage 110, the output driving unit 120 and the bidirectional delay unit 130 in the buffer circuits, the invention prevents short circuit current in output buffer driving stages shown in FIGS. 1 and 2, and thus provides a reduced power consumption and electronmagnetic interference (EMI) than conventional buffer circuits.

Second Embodiment

Figure 5B:
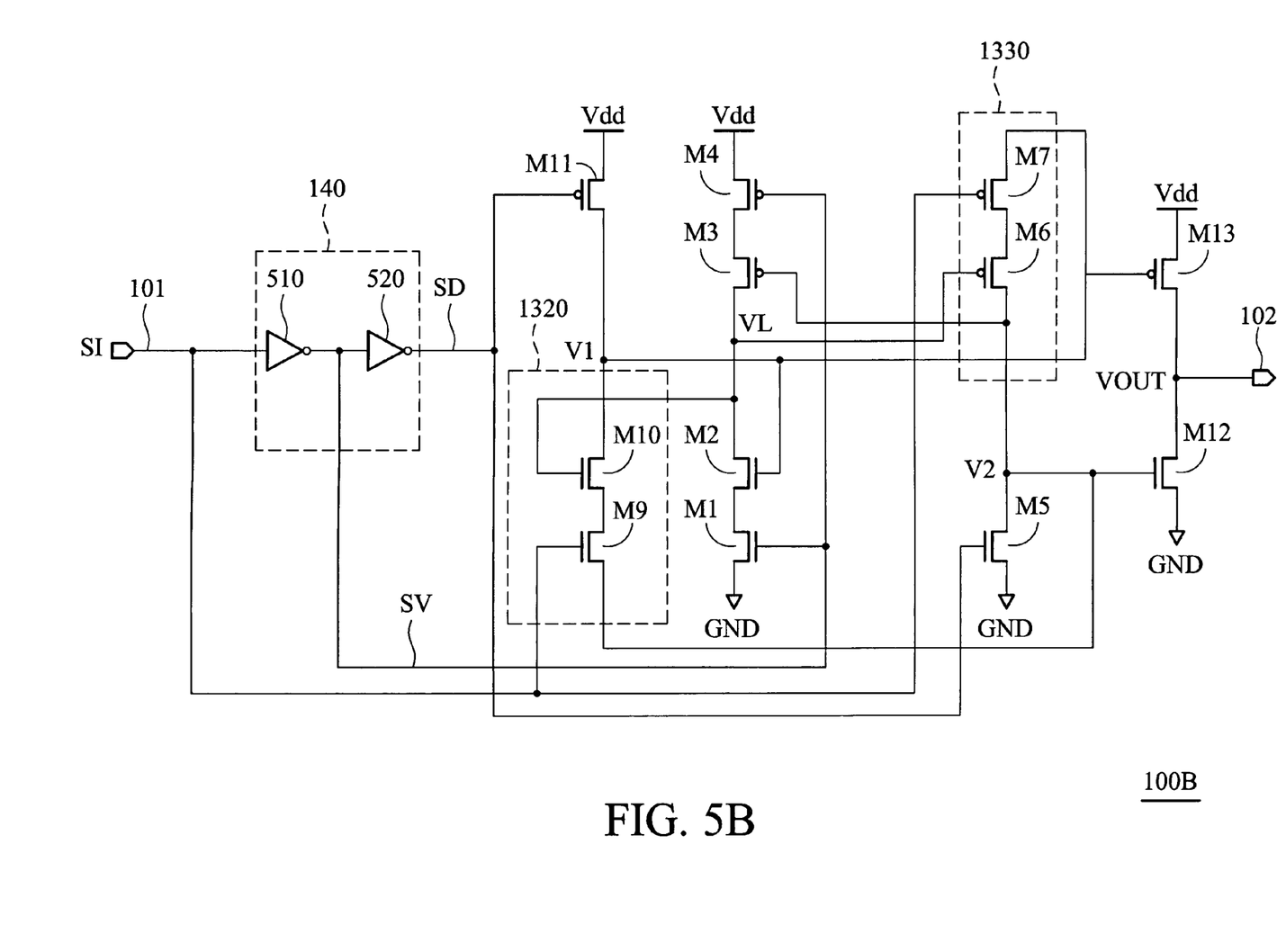
FIG. 5B shows a second embodiment of a bidirectional buffer circuit.

FIG. 5B shows a second embodiment of a buffer circuit. As shown, the buffer circuit 100B is similar to the buffer circuit 100A shown in FIG. 5A, with the exception of the first terminal of the transistor M7 in the bidirectional buffer 1330 being coupled to the control terminal of the transistor M13 rather than the first power source Vdd and the second terminal of the transistor M9 in the bidirectional buffer 1320 being coupled to the control terminal of the transistor M12 rather than the second power source GND. The operation of the buffer circuit 100B is similar to that of the buffer circuit 100A, and thus is omitted for simplicity.

Because the first terminal of the transistor M7 in the bidirectional buffer 1330 is coupled to the control terminal of the transistor M13 and the second terminal of the transistor M9 in the bidirectional buffer 1320 is coupled to the control terminal of the transistor M12, the gate voltage of the transistor M13 from exceeding the gate voltage of the transistor M12 or the gate voltage of the transistor M12 from exceeding the gate voltage of the transistor M13 is automatically prevented.

Third Embodiment

Figure 5C:
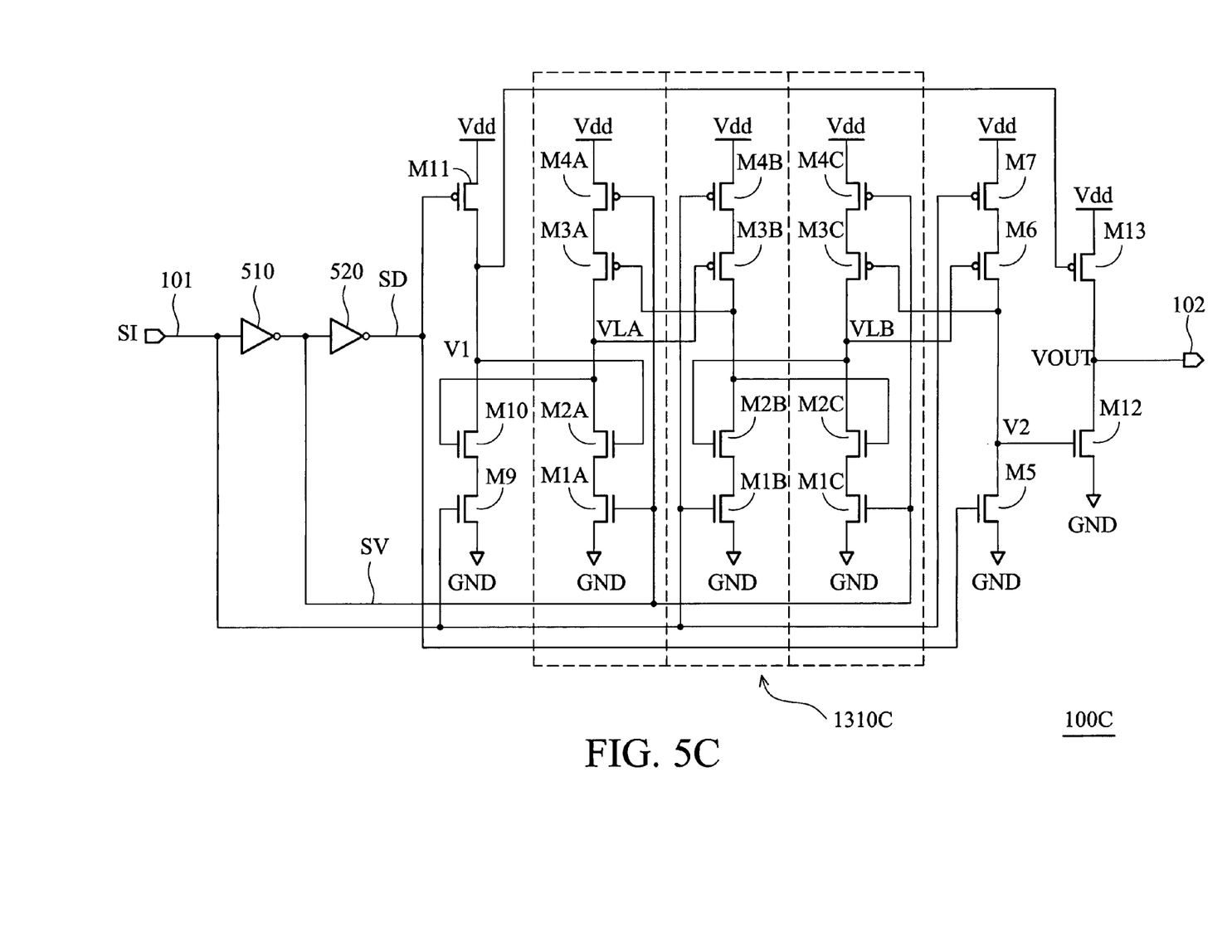
FIG. 5C shows a third embodiment of a bidirectional buffer circuit.

FIG. 5C shows a third embodiment of a buffer circuit. As shown, the buffer circuit 100C is similar to the buffer circuit 100A shown in FIG. 5A, with the exception of the bidirectional logic unit 1310C including three bidirectional logic gates connected in series rather than a single bidirectional logic gate. The operation of the buffer circuit 100C is similar to that of the buffer circuit 100A, and thus is omitted for simplicity.

In the buffer circuit 100C, the delay time thereof can be increased by addition of the bidirectional logic gates, although the total short circuit current does not increase because there is no short circuit current in bidirectional logic gates.

Figure 7:
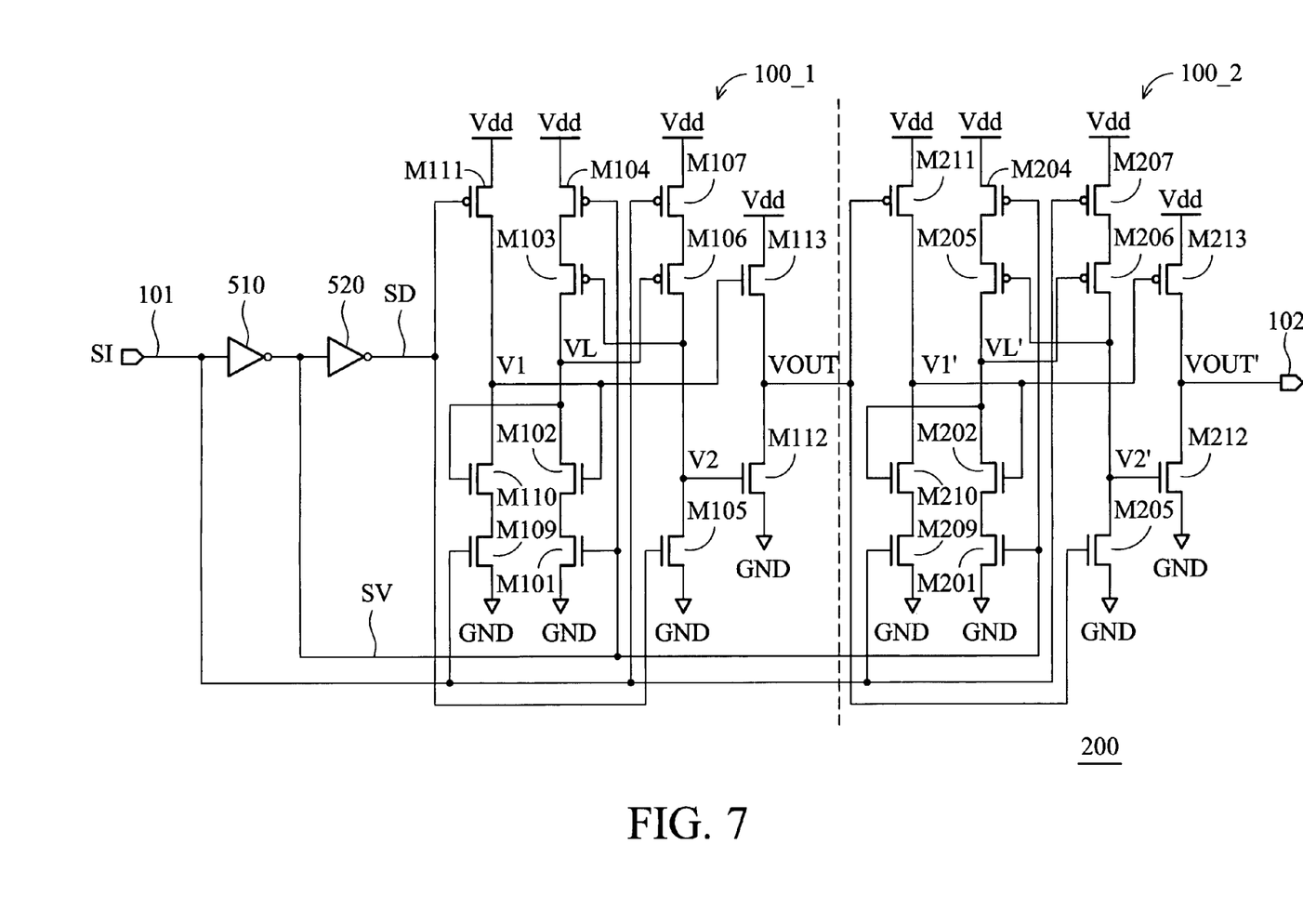
FIG. 7 shows a long delay circuit using the invention.

FIG. 7 shows a long delay circuit using the invention. As shown, the long delay circuit 200 comprises two stages of buffer circuit 100_1 and 100_2 connected in series, in which the output terminal of the buffer circuit 100_1 is coupled to the output driving unit of the buffer circuit 100_2. Each buffer circuit 100_1 and 100_2 is similar to that shown in FIG. 5A. Thus, the short circuit current does not increase by addition of buffer circuits.

Figure 8:
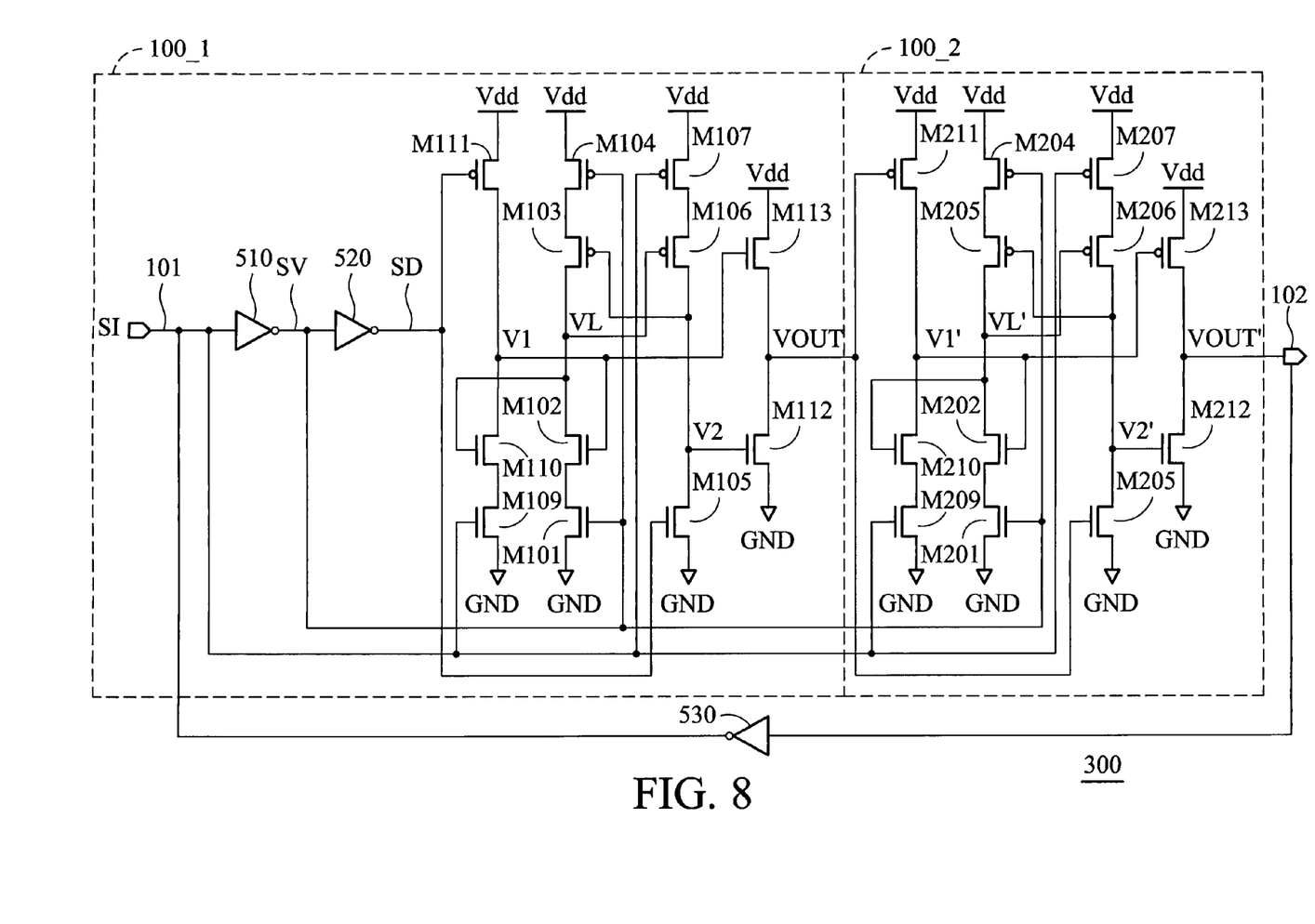
FIG. 8 shows a ring oscillation circuit using the invention.

FIG. 8 shows a ring oscillation circuit using the invention. As shown, a ring oscillation circuit 300 comprises first and second buffer circuits 100_1 and 100_2 connected in series, and the output terminal of first buffer circuit 100_1 is coupled to the output driving unit of the second buffer circuit 100_2. An inverter 530 comprises an input terminal coupled to the output terminal of the second buffer circuit 100_2 and an output terminal coupled to the input terminal of the first buffer circuit 100_1.

Conventional ring oscillators comprise many inverters connected in series, and have short circuit in each inverter, such that short circuit current increases with the number of the inverters. In the ring oscillator circuit of the invention, the short circuit current does not increase with the number of stages because there is no short circuit current in the output stage 110, the output driving unit 120 and the bidirectional delay unit 130 in each stage.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A CMOS buffer circuit, comprising:
an input terminal, receiving an input signal;
an output stage driving an output terminal, comprising a first output transistor of a first conductive type and a second output transistor of a second conductive type;
an output driving unit, producing a first signal to turn off the first output transistor according to a delay signal; and
a bidirectional delay unit, controlled by the input signal, turning on the second output transistor after the first output transistor is turned off, comprising:
a bidirectional logic unit, generating a first logic signal and a second logic signal according to an inversion signal of the input signal; and
first and second bidirectional buffers coupled to the output driving stage, generating a second signal to turn on the second output transistor according to the input signal, the first logic signal and the second logic signal.

2. The CMOS buffer circuit as claimed in claim 1, further comprising a delay circuit generating the delay signal and the inversion signal according the input signal.

3. The CMOS buffer circuit as claimed in claim 2, wherein the delay circuit comprises:
a first inverter comprising an input terminal coupled to the input signal and an output terminal outputting the inversion signal; and
a second inverter comprising an input terminal coupled to the output terminal of the first inverter and an output terminal outputting the delay signal.

4. The CMOS buffer circuit as claimed in claim 2, wherein the output driving unit comprises:
a first transistor of the first conductive type, comprising a first terminal coupled to a first power source, a control terminal coupled to the delay signal, and a second terminal to output the first signal; and
a second transistor of the second conductive type, comprising a first terminal coupled to a second power source, a second terminal to output the second signal and a control terminal coupled to the delay signal.

5. The CMOS buffer circuit as claimed in claim 4, wherein the first bidirectional buffer comprises a third transistor of the second conductive type, comprising a control terminal coupled to the input signal, and a first terminal; and a fourth transistor of the second conductive type, comprising a first terminal coupled to the first terminal of the third transistor, a second terminal coupled to the first signal, and a control terminal coupled to the second logic signal; and the second bidirectional buffer comprises a fifth MOS transistor of the first conductive type, comprising a control terminal coupled to the input signal, and a first terminal; and a sixth MOS transistor of the first conductive type, comprising a first terminal coupled to the first terminal of the fifth MOS transistor, a second terminal to output the second signal, and a control terminal coupled to the first logic signal.

6. The CMOS buffer circuit as claimed in claim 5, wherein the third transistor further comprises a second terminal coupled to the second power source, and the fifth transistor further comprises a second terminal coupled to the first power source.

7. The CMOS buffer circuit as claimed in claim 5, wherein the third transistor further comprises a second terminal coupled to a control terminal of the second output transistor, and the fifth transistor further comprises a second terminal coupled to a control terminal of the first output transistor.

8. The CMOS buffer circuit as claimed in claim 4, wherein the bidirectional logic unit comprises at least one bidirectional logic gate.

9. The CMOS buffer circuit as claimed in claim 8, wherein the bidirectional logic gate comprises:
a seventh transistor of the first conductive type, comprising a first terminal coupled to the first power source, a control terminal coupled to the inversion signal, and a second terminal;
an eighth transistor of the first conductive type, comprising a first terminal coupled to the second terminal of the eight transistor, a control terminal coupled to the second signal, and a second terminal to output the first logic signal;

a ninth transistor of the second conductive type, comprising a first terminal to output the second logic signal, a control terminal coupled to the first signal, and a second terminal;

a tenth transistor of the second conductive type, comprising a first terminal coupled to the second terminal of the ninth transistor, a control terminal coupled to the inversion signal and a second terminal coupled to the second power source.

10. The CMOS buffer circuit as claimed in claim 9, wherein the bidirectional logic gate further comprises:

an eleventh transistor of the first conductive type, comprising a first terminal coupled to the second terminal of the seventh transistor, a control terminal coupled to the first signal, and a second terminal to the second terminal of the eighth transistor; and a twelfth transistor of the second conductive type, comprising a first terminal coupled to the second terminal of the ninth transistor, a control terminal coupled to the second signal and a second terminal coupled to the first terminal of the tenth transistor.

11. The CMOS buffer circuit as claimed in claim 4, wherein the bidirectional logic unit comprises a plurality of bidirectional logic gates connected in series.

12. An integrated circuit, comprising at least two stages of CMOS buffer circuit as claimed in claim 1, connected in series, wherein the output terminal of each stage is coupled to the output driving unit of the next stage.

13. A ring oscillation circuit, comprising:

first and second CMOS buffers as claimed in claim 1, connected in series, wherein the output terminal of first CMOS buffer circuit is coupled to the output driving unit of the second CMOS buffer circuit; and an inverter comprising an input terminal coupled to the output terminal of the second CMOS buffer circuit and an output terminal coupled to the input terminal of the first CMOS buffer circuit.

\* \* \* \* \*